(12) United States Patent
Wang et al.

(10) Patent No.: US 10,536,182 B2
(45) Date of Patent: Jan. 14, 2020

(54) BIDIRECTIONAL OSCILLATOR-BASED RADIO WITH INTEGRATED ANTENNA

(71) Applicant: Georgia Tech Research Corporation, Atlanta, GA (US)

(72) Inventors: Hua Wang, Marietta, GA (US); Taiyun Chi, Atlanta, GA (US); Min-Yu Huang, Smyrna, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 15/778,499

(22) PCT Filed: Nov. 18, 2016

(86) PCT No.: PCT/US2016/062799
§ 371 (c)(1),
(2) Date: May 23, 2018

(87) PCT Pub. No.: WO2017/091466
PCT Pub. Date: Jun. 1, 2017

(65) Prior Publication Data
US 2018/0358995 A1 Dec. 13, 2018

Related U.S. Application Data

(60) Provisional application No. 62/259,348, filed on Nov. 24, 2015.

(51) Int. Cl.
*H04B 1/40* (2015.01)
*H01Q 23/00* (2006.01)
(Continued)

(52) U.S. Cl.
CPC ............. *H04B 1/40* (2013.01); *H01L 23/66* (2013.01); *H01Q 5/35* (2015.01); *H01Q 9/42* (2013.01);
(Continued)

(58) Field of Classification Search
USPC .......... 343/700 MS, 853, 66.1; 455/80, 90.3, 455/575.1
See application file for complete search history.

(56) References Cited

U.S. PATENT DOCUMENTS 5,987,309 A * 11/1999 Adachi ................. H03D 7/161
455/86
6,452,909 B1 9/2002 Bauer
(Continued)

FOREIGN PATENT DOCUMENTS

EP 1944829 A2 7/2008
WO 2012/034103 A2 3/2012

OTHER PUBLICATIONS

Extended European Search Report corresponding to European Application No. 16869108.7 (10 pages) (dated Nov. 18, 2019).

*Primary Examiner* — Yuwen Pan
*Assistant Examiner* — Erica L Fleming-Hall
(74) *Attorney, Agent, or Firm* — Myers Bigel, P.A.

(57) ABSTRACT

A packaged integrated circuit device includes a transceiver with one or more oscillators therein. The oscillators can be configured as harmonic or fundamental-frequency oscillators for signal transmitting, or they can be configured as regenerative receivers for signal receiving. An antenna is provided in the package and, preferably, on the same chip IC chip as the transceiver. The antenna includes one or more feeds, which are coupled to the one or more oscillators. A dual-function varactor/envelope detector is provided, which is electrically coupled to the one or more oscillators. A control circuit is provided, which is configured to drive nodes of the transceiver and the dual-function varactor/envelope detector with a first plurality of reference voltages during operation of the transceiver as a radio transmitter (with varactor) and a second plurality of reference voltages
(Continued)

during operation of the transceiver as a radio receiver (with envelope detector).

29 Claims, 5 Drawing Sheets

(51) Int. Cl.
    *H01Q 9/42*     (2006.01)
    *H01L 23/66*     (2006.01)
    *H01Q 5/35*     (2015.01)
    *H04L 27/04*     (2006.01)

(52) U.S. Cl.
    CPC ..... *H01Q 23/00* (2013.01); *H01L 2223/6627* (2013.01); *H01L 2223/6677* (2013.01); *H04L 27/04* (2013.01)

(56) References Cited

U.S. PATENT DOCUMENTS

| | | | | |
|---|---|---|---|---|
| 9,350,406 | B1* | 5/2016 | Chen | H04B 17/18 |
| 2003/0098746 | A1* | 5/2003 | Aikawa | H03B 21/01 |
| | | | | 331/56 |
| 2003/0112862 | A1* | 6/2003 | Joe | H04L 27/12 |
| | | | | 375/238 |
| 2004/0095287 | A1 | 5/2004 | Mohamadi | |
| 2005/0113035 | A1* | 5/2005 | Kyongyop O | H01Q 1/38 |
| | | | | 455/90.3 |
| 2006/0087473 | A1 | 4/2006 | Song et al. | |
| 2007/0176697 | A1* | 8/2007 | May | H03L 7/0996 |
| | | | | 331/57 |
| 2007/0178848 | A1* | 8/2007 | Han | H04B 1/401 |
| | | | | 455/76 |
| 2009/0072920 | A1* | 3/2009 | Wachi | H03B 5/1228 |
| | | | | 331/117 R |
| 2009/0085810 | A1* | 4/2009 | Soler Castany | H01L 23/66 |
| | | | | 343/700 MS |
| 2011/0025415 | A1* | 2/2011 | Mu | H03F 1/56 |
| | | | | 330/251 |
| 2012/0149321 | A1* | 6/2012 | Montalvo | H04B 1/30 |
| | | | | 455/232.1 |
| 2012/0184234 | A1* | 7/2012 | Goldberg | H04B 1/30 |
| | | | | 455/255 |
| 2013/0141175 | A1* | 6/2013 | Yin | H03B 5/1847 |
| | | | | 331/96 |
| 2015/0043623 | A1* | 2/2015 | Kawasaki | H04B 1/40 |
| | | | | 375/219 |
| 2016/0268977 | A1* | 9/2016 | Ito | H03F 1/42 |
| 2018/0247192 | A1* | 8/2018 | Fick | G06N 3/08 |

* cited by examiner

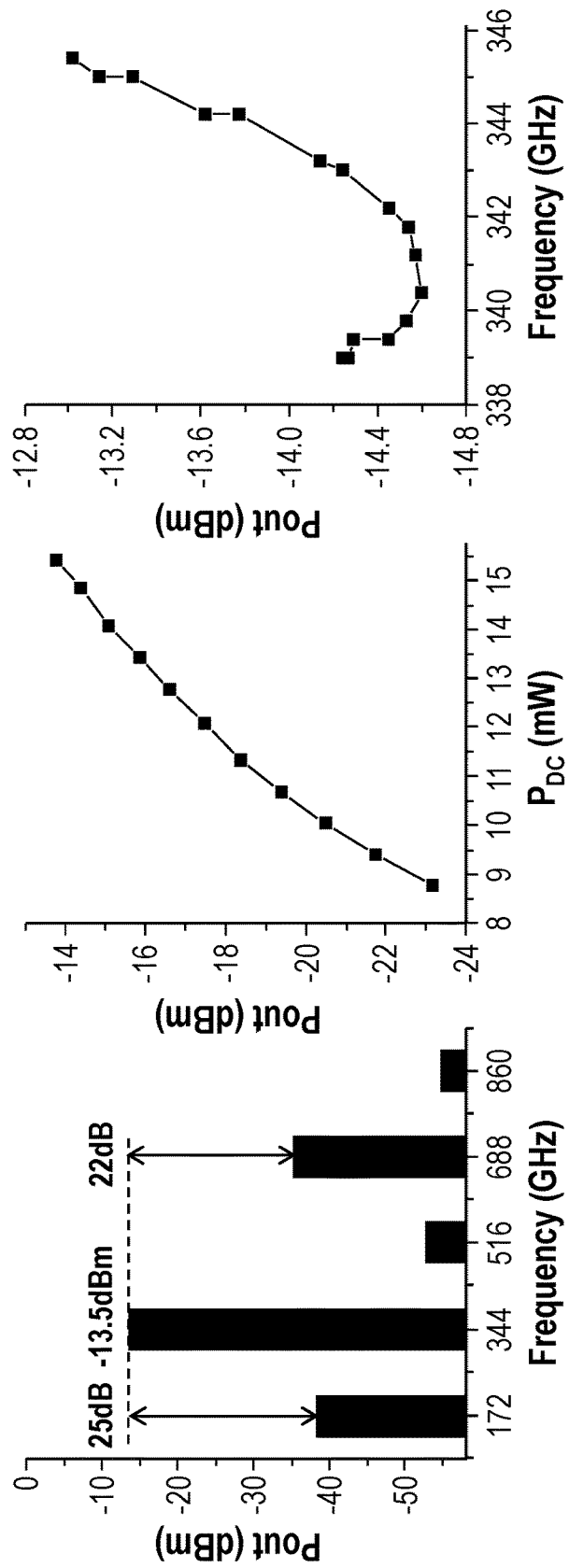

BIDIRECTIONAL OSCILLATOR-BASED RADIO WITH INTEGRATED ANTENNA

REFERENCE TO PRIORITY APPLICATION

The present application is a 35 U.S.C. § 371 national stage application of PCT International Application Serial No. PCT/US2016/062799, filed on Nov. 18, 2016, which itself claims priority to U.S. Provisional Application Ser. No. 62/259,348, filed Nov. 24, 2015, the disclosure of both of which are hereby incorporated herein by reference. The above-referenced PCT International Application was published in the English language as International Publication No. WO 2017/091466 A1 on Jun. 1, 2017.

FIELD OF THE INVENTION

The present invention relates to integrated circuit devices and, more particularly, to integrated circuit devices having high frequency radio transceivers therein and methods of operating same.

BACKGROUND OF THE INVENTION

There is an ongoing need for highly integrated radio systems in low-cost silicon platforms to address field-deployable and massively-producible applications in military systems and commercial markets, including wireless sensor networks, medical implantable devices, and swarm multi-robot systems. However, these applications typically place stringent requirements on the radio solutions which need to offer an ultra-compact form-factor, an ultra-low power consumption, a sufficient communication distance, and a useful data rate. Most existing integrated radio solutions, however, cannot satisfy such demanding SWaP (Size-Weight-and-Power) requirements. Accordingly, it remains a challenge to push the power consumption limit in conventional radio architectures even with various low-power design techniques. Moreover, the physical size of GHz or mm-Wave radios is fundamentally dominated by the size of the antenna at millimeter or even centimeter scales.

The continuous device scaling in silicon IC technologies (e.g., CMOS, SiGe HBT) has opened the door to radios operating at mm-Wave and THz frequencies. Such a high operating frequency allows a drastic reduction of the antenna sizes as well as the whole radio form-factor to the sub-millimeter scales. However, most nm-Wave and THz radios consume substantial DC power, often from hundreds of milli-watts to watts, incompatible with field-deployable applications.

SUMMARY OF THE INVENTION

Integrated circuit devices according to embodiments of the invention include a nano-scaled mm-Wave/terahertz (THz) radio configured as a packaged mm-Wave/THz transceiver on an integrated circuit chip with a fully integrated antenna. This antenna may be configured as an on-chip and/or co-packaged antenna (e.g., multi-slot/multi-feed antenna). According to some of these embodiments of the invention, the mm-Wave/THz radio transceiver is configured as a bidirectional circuit-sharing radio that can be selectively configured (e.g., digitally controlled) either as a harmonic-oscillator based mm-Wave/THz transmitter or as a super-harmonic regenerative mm-Wave/THz receiver (or just fundamental-frequency THz receiver), which have an ultra-compact form factor that can operate at ultra-low power. The on-chip/co-packaged multi-feed antenna structure also achieves spatial power combining/splitting and radiation for the mm-Wave/THz transmitting/receiving signals with minimal signal loss. This antenna may be patterned on-chip to achieve antenna-level power combining and obviate any need for a lossy on-chip power combining network or separate packaging. In some embodiments of the invention, the radio transceiver may be configured to include first and second matched oscillators, which are electrically coupled together, and the antenna may be configured to support oscillator synchronization with first and second feeds that are electrically coupled to the first and second oscillators, respectively.

According to additional aspects of these embodiments of the invention, corresponding first output terminals of the first and second oscillators are electrically shorted together and corresponding second output terminals of the first and second oscillators are electrically shorted together. In addition, a common-mode node of the first oscillator is electrically coupled to the first feed and a common-mode node of the second oscillator is electrically coupled to the second feed. The first and second oscillators, which may have shared differential output terminals, may operate collectively as a push-push harmonic oscillator that generates a second harmonic signal from a fundamental oscillation signal ($f_o$). During this harmonic operation, the transceiver may operate as a radio frequency transmitter in response to an on-off-keying (OOK) modulation or amplitude-shift-keying (ASK) modulation signal. On-off-keying (OOK) or amplitude-shift-keying (ASK) is preferably chosen to, among other things, preclude on-chip coherent local oscillator (LO) signal generation.

According to still further embodiments of the invention, the transceiver can include a pair of MOS transistors having commonly-connected drain terminals and commonly-connected source terminals, which can perform a dual function as a varactor or as an envelope detector when the transceiver is disposed in a transmitting mode or a receiving mode, respectively. A gate terminal of a first of the pair of MOS transistors may be electrically coupled to a first of the shared differential output terminals and a gate terminal of a second of the pair of MOS transistors may be electrically coupled to a second of the shared differential output terminals. In addition, a first pair of load inductors is provided, which are electrically connected to the differential output terminals of the first oscillator, and a second pair of load inductors is provided, which are electrically connected to the differential output terminals of the second oscillator. These first and second pairs of load inductors may be configured as microstrip transmission lines on the integrated circuit chip. A tail current source may also be provided to support digital control of the transceiver. This tail current source may be configured as a pull-down transistor having a gate terminal responsive to the OOK modulation control signal when the transceiver is operated as an RF transmitter, or responsive to an oversampled quench signal when the transceiver is operated as an RF receiver.

According to additional embodiments of the invention, the transceiver can be controlled to operate as a fully-integrated super-harmonic (e.g., $2^{nd}$ harmonic) regenerative receiver that detects incoming mm-Wave/THz signals, which are injection-locked to the receiver operating at a lower frequency (e.g., half of the incoming THz frequency). This transceiver architecture can substantially improve receiver sensitivity and reduce receiver power consumption. When operating as a transmitter, the fully integrated push-push harmonic oscillator can generate a $2^{nd}$ harmonic THz output signal from a fundamental oscillation signal ($f_o$). Two on-chip fundamental oscillators are directly coupled to each other to increase the total output power. On-off-keying (OOK) modulation can be efficiently handled by turning on/off these paired harmonic oscillators.

According to still further embodiments of the invention, an integrated circuit device includes an integrated circuit package and a transceiver in the package. The transceiver includes first and second oscillators therein, which have respective pairs of cross-coupled differential input terminals and differential output terminals that are joined in a push-push oscillator configuration. A multi-feed antenna is also provided, which has first and second feeds electrically coupled to first and second common-mode nodes of the first and second oscillators, respectively, in the package. A dual-function varactor and envelope detector is provided, which is electrically coupled to the first and second oscillators. A control circuit is provided, which is configured to drive nodes of the transceiver and the dual-function varactor and envelope detector with a first plurality of reference voltages during operation of the transceiver as a radio transmitter and a second plurality of reference voltages during operation of the transceiver as a radio receiver.

According to some of these embodiments, the transceiver includes a symmetric injection circuit. This injection circuit includes first and second serially-connected injection transistors having respective first and second gate terminals electrically coupled (directly or by transmission lines) to the first and second feeds. The first and second injection transistors may be NMOS transistors having commonly-connected emitter terminals, which are responsive to reference voltages generated by the control circuit. In addition, a drain terminal of the first injection transistor may be electrically coupled to a first of the differential output terminals of the first oscillator and a drain terminal of the second injection transistor may be electrically coupled to a first of the differential output terminals of the second oscillator. Alternatively, the transceiver may also include an asymmetric injection circuit.

The transceiver may also include a first pair of load inductors, which are electrically connected to the differential output terminals of the first oscillator, and a second pair of load inductors, which are electrically connected to the differential output terminals of the second oscillator. These load inductors may be configured as microstrip transmission lines (TLs). A tail current source may also be provided, which receives an on-off-keying (OOK) modulation control signal during a transmitting mode and a quench signal (e.g., 4× oversampled) during a receiving mode. This tail current source may be configured as a pull-down transistor having a gate terminal responsive to the OOK modulation control and quench signals.

The nano-scaled, ultra-low-power and low-cost radio transceivers described herein can be employed in a wide variety of applications, including defense and commercial applications. In the defense space, the proposed nano-scaled transceivers can be utilized to realize ubiquitous large-scaled wireless sensor networks for surveillance. If the transceivers are deployed on insects or swarm mini-robots, a distributed, yet real-time dynamic wireless sensor network, can be achieved. When operated in parallel (e.g., for large-volume commercial markets), the nano-scaled transceivers described herein can be readily adopted as the low-power and compact sensing/communication nodes for Internet-of-Things (IoT) applications, for example.

BRIEF DESCRIPTION OF THE DRAWINGS

FIG. 2A is a histogram showing a simulated transmitter output spectrum at one antenna input feed, for the bidirectional radio of FIGS. 1A-1B.

FIG. 2B is a graph showing simulated output power at 344 GHz with back-off operation, for the bidirectional radio of FIGS. 1A-1B.

FIG. 2C is a graph showing transmitter output power at different output frequencies by tuning reference voltage $Vb_2$, for the bidirectional radio of FIGS. 1A-1B.

DETAILED DESCRIPTION OF EMBODIMENTS

Figure 1A:
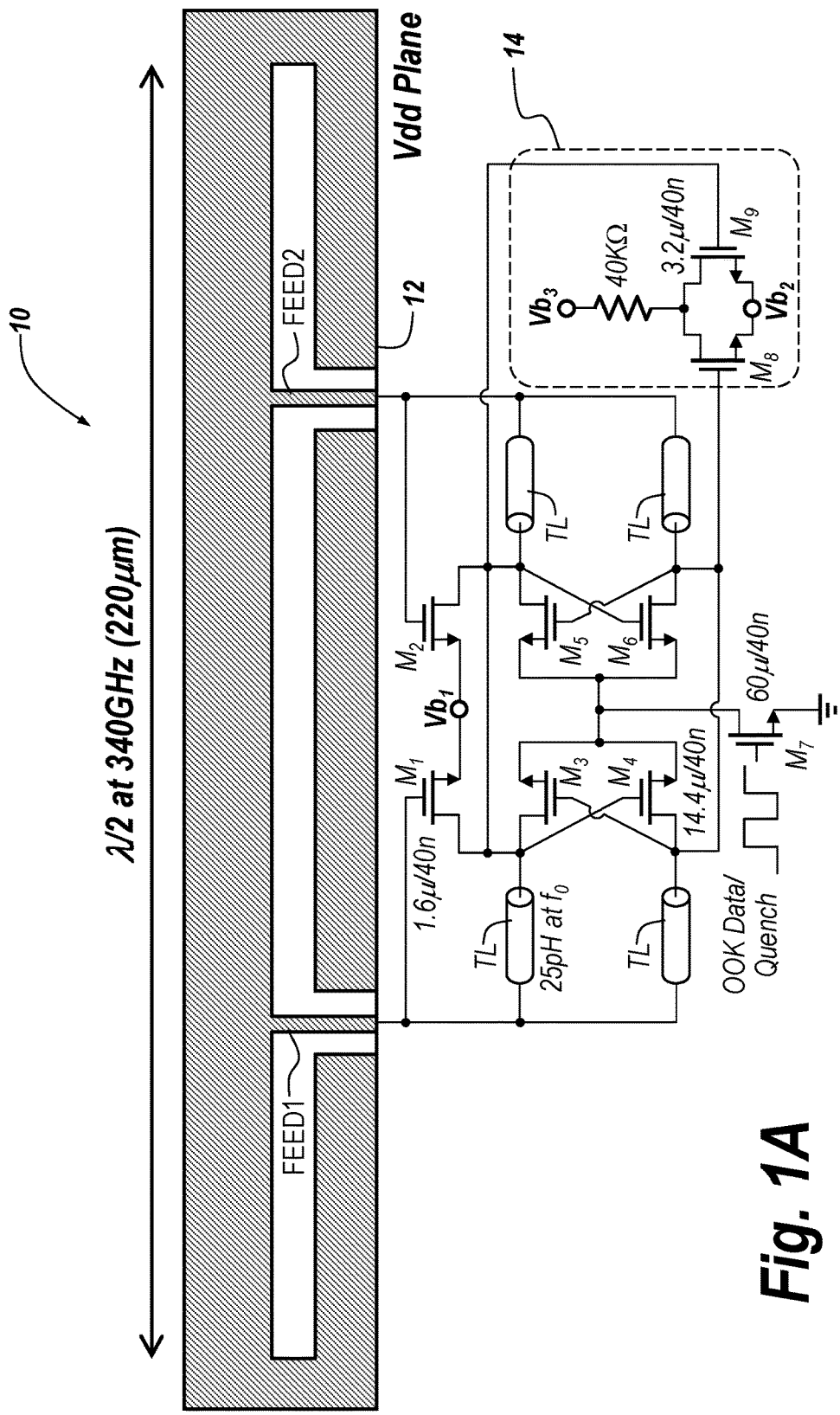
FIGS. 1A-1B are an electrical schematic of a packaged bidirectional radio with multi-feed antenna and dual-function varactor/envelope detector, according to embodiments of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
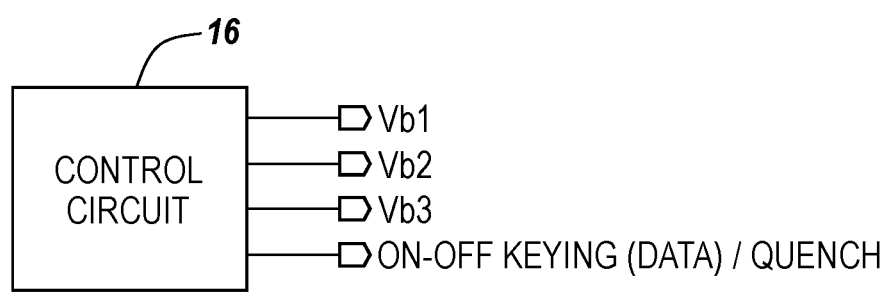

Referring now to FIGS. 1A-1B, a bidirectional integrated circuit radio 10 with an on-chip multi-feed slot antenna 12 and a dual-function varactor/envelope detector 14 is illustrated. This radio 10 uses an oscillator core, which serves as the fundamental building block to the system and can be fully configured in either a transmitting mode (Tx) or a receiving mode (Rx) to achieve bidirectional TRx within a compact integrated circuit (IC) chip area. In particular, and as illustrated herein, the radio 10 can be selectively configured in a super-harmonic, sub-harmonic, or fundamental-frequency regenerative receiver architecture in the receiving mode (instead of classical heterodyne or direct-conversion architecture) to thereby improve receiver sensitivity below, around, or above transistor $f_{max}$. Also, as illustrated herein, the radio 10 can be selectively configured in a harmonic or fundamental-frequency transmitter, and the fundamental-frequency or harmonic oscillation signals drive the antenna for transmitter radiation below, around, or above transistor $f_{max}$. In addition, the on-chip slot antenna 12, preferably with semiconductor substrate thinning, is used to achieve compact chip layout and efficient backside radiation. This multi-feed slot antenna architecture is used to achieve antenna-level power combining and avoid the need for a relatively lossy on-chip power combining network. Nonetheless, other types of antennas and possibly multiple antennas may be used.

To meet system size requirements of about $10^{-11}$ m$^3$, a CMOS THz radio 10 can be implemented using only 10% of the total system volume (i.e., $10^{-12}$ m$^3$) and an energy "harvester" is implemented within the other 90% of the volume. Assuming a thinned CMOS chip thickness of about 50 μm, the chip area can fit within about 2×10$^4$ μm$^2$ (e.g., 250 μm×80 μm). As will be understood by those skilled in the art, a direct tradeoff exists between the size of the antenna 12 and the system operating frequency within such a small chip area. In some of the embodiments described herein, a 340 GHz carrier frequency is targeted. This THz level frequency can be generated as the 2nd harmonic signal from an on-chip fundamental oscillator operating at $f_0$=170 GHz.

Figure 4:
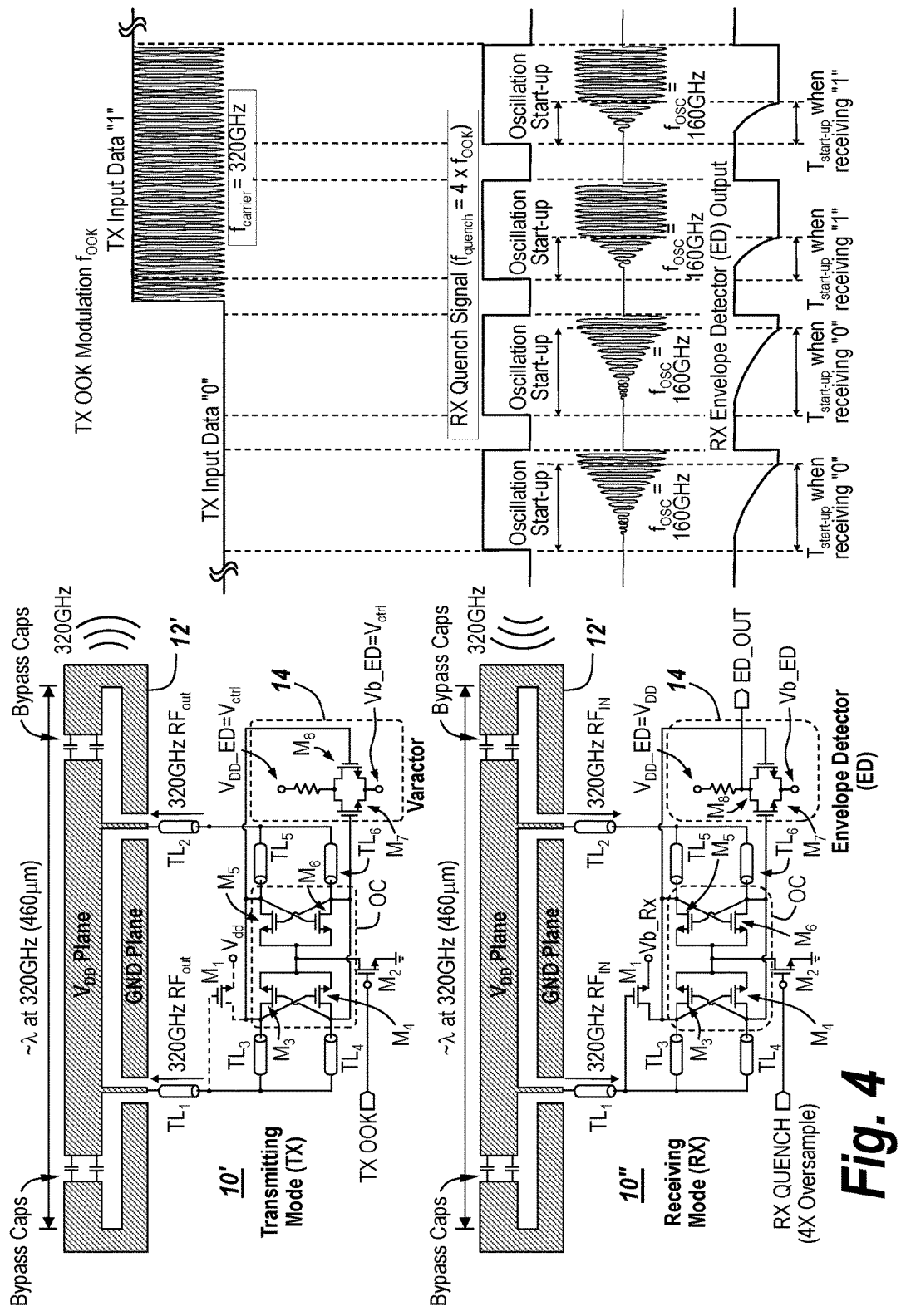
FIG. 4 is a pair of electrical schematics of a packaged bidirectional radio frequency transceiver (with antenna) and a pair of corresponding timing diagrams, which show operation in a transmitting mode and receiving mode, according to embodiments of the invention.

For deep-scaled CMOS technologies, such as 32 nm semiconductor-on-insulator (SOI), the $f_{max}$ of transistors is typically about 350 GHz. The $f_{max}$ of transistors sets the upper frequency limit for the power amplification and fundamental oscillation. However, after considering the loss of on-chip passive components, the maximum allowed oscillation frequency typically decreases substantially compared with transistor $f_{max}$. Therefore, in order to perform power generation at THz range (300 GHz-3 THz), passive frequency multipliers or active frequency multipliers should typically be used. Passive frequency multipliers can achieve THz signal generation with low DC power consumption, but often exhibit substantial conversion loss and typically rely on high power mm-wave pumping signals. Generating such high power pumping signals at mm-wave frequency is typically very energy inefficient. On the other hand, the harmonic signal can typically be extracted from a fundamental oscillator as an active frequency multiplier. For example, the push-push oscillator configuration illustrated herein can enable a 2$^{nd}$ harmonic extraction at its common-mode node, while the fundamental tone and all the odd-order harmonic signals are cancelled As illustrated by FIGS. 1A-1B, a desired 340 GHz carrier frequency (2$^{nd}$ harmonic signal) is generated from a fundamental oscillator at 170 GHz, leading to an on-chip half-wavelength slot antenna 12 of 220 μm, as shown by FIGS. 1A-1B. Alternatively, as illustrated by FIG. 4, a 320 GHz carrier frequency (2$^{nd}$ harmonic signal) can be generated from a fundamental oscillator at 160 GHz. At higher operating frequencies, the size of the antenna 12 can be reduced to save chip area, but this will typically require either: (i) a fundamental oscillator at higher frequency, or (ii) generating the harmonic signal directly from the oscillator. Moreover, as the oscillation frequency approaches the transistor $f_{max}$, the output swing of the oscillator normally decreases, which makes the devices less nonlinear, generates less harmonic current, and decreases the transmitter output power.

As shown by the timing diagram in FIG. 4, on-off-keying (OOK) modulation is utilized, which eliminates on-chip coherent local oscillator (LO) signal generation to thereby save power. Other types of modulation may also be used, such as amplitude-shift-keying (ASK), frequency-shift-keying (FSK), phase-shift keying (PSK) and quadrature-amplitude modulation (QAM), as well as amplitude modulation (AM), frequency modulation (FM) and phase-modulation (PM).

The radio receiver is implemented as a power detector (with super-harmonic regenerative operation) to further simplify the receiver architecture. Based on this modulation format, the link budget can be calculated using the Friis transmission equation, as:

$$P_R = P_T + G_T + G_R + 20 \times \log_{10}\left(\frac{\lambda}{4\pi R}\right),$$

where $P_R$ is the received power, $P_T$ is the transmitted power, $G_T$ is the transmitter antenna gain, $G_R$ is the receiver antenna gain. For a communication range of 1 m, assuming a 200 kb/s OOK modulation data rate, a −10 dBm transmitter output power and a 3.9 dB antenna gain, the received signal power level is around −85 dBm at its input. In addition, the signal-to-noise ratio (SNR) of the receiver can be estimated with the given received power, as:

SNR=$P_A$−174 dBm/Hz−NF+20×log(BW)=35 dB−NF, where NF is the receiver noise figure, and BW denotes the modulation bandwidth. At a carrier frequency of 340 GHz, it is challenging to design a CMOS amplifier. Therefore, one can either choose a mixer-first topology, which normally has a high NF because of the conversion loss, or utilize the regenerative architecture described herein. Thus, in the embodiments described herein, a Tx oscillator is used as a super-harmonic regenerative receiver in the Rx mode to achieve OOK demodulation with low power consumption. Circuit block sharing also helps to substantially decrease the chip area.

Referring again to FIGS. 1A-1B, the packaged bidirectional radio 10 (i.e., transceiver) is illustrated as including an on-chip (or, at least, co-packaged) multi-feed slot antenna 12 (λ/2=220 μm at 340 GHz) and a dual-function varactor/ envelope detector 14. The radio 10 includes first and second matched oscillators having respective pairs of cross-coupled differential input terminals and differential output terminals that are joined together in a push-push oscillator configuration. As shown, the first oscillator includes NMOS transistors M3, M4 (W=14.4 μm, L=40 nm) having commonly-connected emitter terminals and the second oscillator includes NMOS transistors M5, M6 (W=14.4 µm, L=40 nm) having commonly-connected emitter terminals, connected as illustrated. A gate terminal of NMOS transistor M3 is electrically connected to a differential output terminal of the first oscillator, which corresponds to a drain terminal of NMOS transistor M4. Similarly, a gate terminal of NMOS transistor M4 is electrically connected to a differential output terminal of the first oscillator, which corresponds to a drain terminal of NMOS transistor M3. A gate terminal of NMOS transistor M5 is electrically connected to a differential output terminal of the second oscillator, which corresponds to a drain terminal of NMOS transistor M6. Similarly, a gate terminal of NMOS transistor M6 is electrically connected to a differential output terminal of the second oscillator, which corresponds to a drain terminal of NMOS transistor M5.

The first oscillator further includes a first pair of inductors, which are illustrated as transmission lines (TLs) having an inductance of 25 pH (at $f_0$). The first pair of inductors are commonly-connected at a common-mode node of the first oscillator, which is electrically coupled to a first feed (1) of the multi-feed slot antenna 12. The second oscillator further includes a second pair of inductors, which are illustrated as transmission lines (TLs) having an inductance of 25 pH (at $f_0$). The second pair of inductors are commonly-connected at a common-mode node of the second oscillator, which is electrically coupled to a second feed (2) of the multi-feed slot antenna 12. Moreover, according to additional embodiments of the invention, the coupling between the oscillators and the coupling between the antenna(s) and the oscillators may be electrical (as shown), magnetic or electromagnetic.

The dual-function varactor/envelope detector 14 includes NMOS transistors M8, M9 (W=3.2 µm, L=40 nm) having commonly-connected emitter terminals and commonly-connected drain terminals. As shown, the commonly-connected emitter terminals are responsive to a variable bias voltage $Vb_2$, which is provided by a control circuit 16, and the commonly-connected drain terminals are electrically coupled by a pull-up resistor (e.g., 40K ohms) to a variable bias voltage $Vb_3$, which equals $Vb_2$ during the transmitting mode but is greater than $Vb_2$ (e.g., Vdd) during the receiving mode. In addition, a gate terminal of NMOS transistor M8 is electrically connected to a pair of differential output terminals associated with the first and second oscillators and a gate terminal of NMOS transistor M9 is electrically connected to an opposite pair of differential output terminals associated with the first and second oscillators, as illustrated.

An NMOS pull-down transistor M7 (W=60 µm, L=40 nm), having a drain terminal connected to emitter terminals of the oscillator transistors M3-M6, operates as a tail current source. This current source is responsive to an on-off-keying (OOK) modulation signal, which provides transmission data (Tx data) during a transmitting mode of operation, or a quench signal when the radio 10 is operating as a receiver during a receiving mode of operation.

Moreover, during the receiving mode of operation, a symmetric injection circuit is selectively enabled, but during the transmitting mode of operation the injection circuit is selectively disabled. This injection circuit includes NMOS transistors M1, M2 (W=1.6 µm, L=40 nm) having commonly connected emitter terminals, which are responsive to a variable bias voltage $Vb_1$ generated by the control circuit 16. The magnitude of $Vb_1$ determines whether the injection circuit is active ($Vb_1$<Vdd) or inactive (e.g., $Vb_1$=Vdd). As shown, the drain terminals of NMOS transistors M1 and M2 are shorted together and to corresponding differential output terminals of the first and second oscillators (and gate terminal of M9). The gate terminals of NMOS transistors M1 and M2 are electrically coupled to respective ones of the first and second feeds (1) and (2) of the antenna 12.

As further illustrated by FIGS. 1A-1B, the power supply of the oscillator (i.e., Vdd) can be provided through the power plane of the slot antenna 12. To achieve the desired operation, the two-feed slot antenna 12 requires two driving signals with the same phase and amplitude at its two input feeds (1) and (2). In the transmitting mode, $M_1$ and $M_2$ are turned off by setting $Vb_1$ to Vdd. Transistors $M_3$, $M_4$ form one cross-coupled oscillator core and transistors $M_5$, $M_6$ form another cross-coupled oscillator core. The four load inductors, which may be implemented as microstrip transmission lines, achieve 25 pH at 170 GHz. To ensure that the driving signals are in-phase with the same amplitude at the two antenna input feeds (1) and (2), the two oscillators are coupled together by shorting their positive outputs and negative outputs, respectively, as illustrated. Tail current source $M_7$ is turned on/off to provide the OOK modulation. The desired $2^{nd}$ harmonic outputs are taken from the common-mode nodes of the coupled oscillators and directly radiate out through the feeds (1) and (2) of the on-chip antenna 12. In addition, NMOS transistors $M_8$ and $M_9$ are configured as a varactor to provide frequency tuning. Different transceiver circuitry can be used when different numbers or types of antenna are used.

Referring now to FIG. 2A, a simulated output spectrum for the fundamental, $2^{nd}$, $3^{rd}$, $4^{th}$ and $5^{th}$ harmonic signals is shown. In this simulation, schematic-level transistor models in the IBM 32 nm SOI design kit and the EM simulated S-parameters of the antenna are used. The peak CW output power is −13.5 dBm at $2f_0$ (344 GHz) and the total output power from two antenna feeds is −10.5 dBm, with a total power consumption of 15 mW at a level where Vdd=1.1 V. The harmonic suppressions of the fundamental leakage and the $4^{th}$ harmonic signal are −25 dBc and −22 dBc, respectively. If the distance between Tx and Rx decreases, the transmitter output power can also be reduced to save total power consumption, as shown by FIG. 2B. This can be achieved by reducing the tail current value of the oscillators.

As previously highlighted, the bias voltage $Vb_2$ can be used for frequency tuning, which means the output power can be adjusted as shown by FIG. 2C. In particular, a total 6.5 GHz CW frequency tuning range (1.5%) is achievable from 339 GHz to 345.5 GHz. This output power variation is within 2 dB across the frequency tuning range provided by the varactor 14 and $Vb_2$ (where $Vb_3=Vb_2$).

Figure 3:
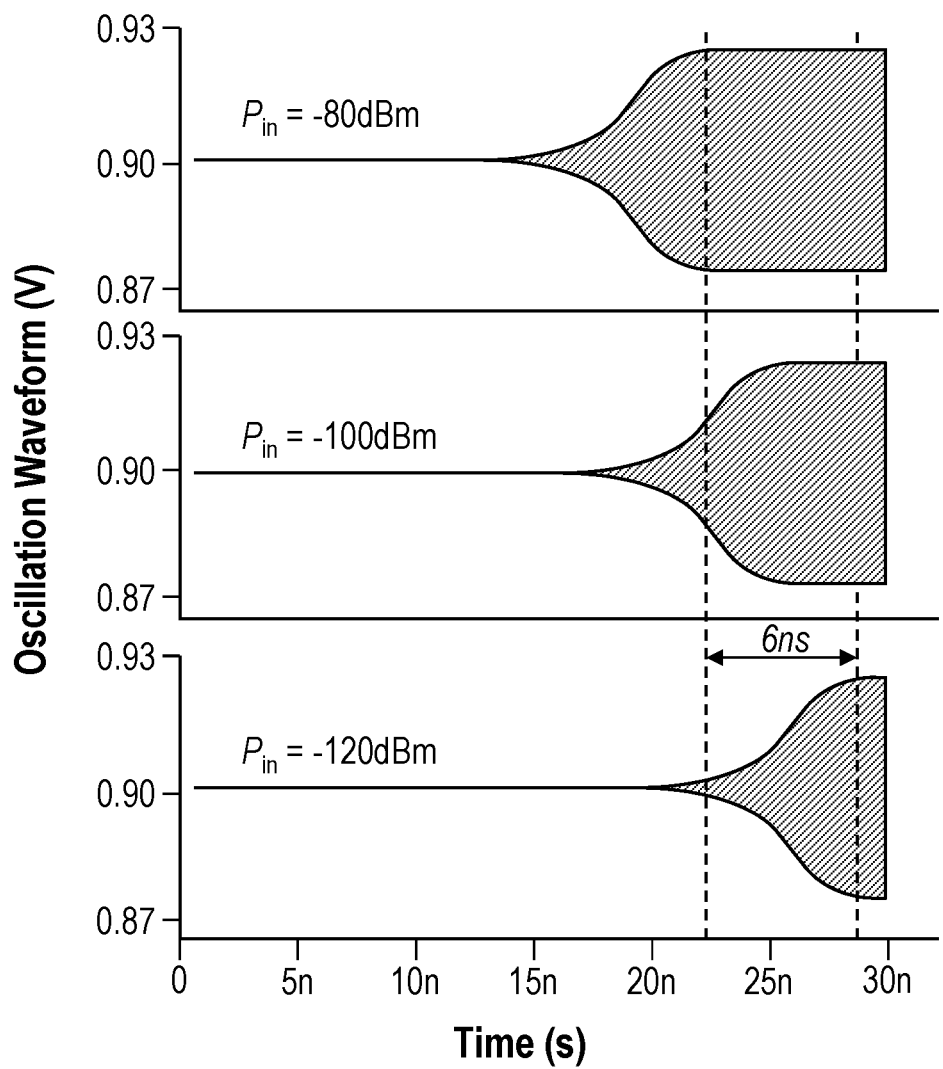
FIG. 3 is a graph showing oscillation startup time (x-axis) versus antenna input power for the bidirectional radio of FIGS. 1A-1B.

As will be understood by those skilled in the art, because no amplifier can be designed above $f_{max}$, classical heterodyne receivers typically suffer from high conversion loss and noise figure at frequency near or above $f_{max}$. An alternative solution, as illustrated herein, is the regenerative receiver, which can readily demodulate OOK signals or other types of modulations, including ASK, FSK, PSK, QAM, AM, FM and PM. Thus, as shown by FIGS. 1A-1B, the radio 10 can be selectively configured as a super-harmonic ($2^{nd}$ harmonic) regenerative receiver by adjusting the bias voltages $Vb_1$, $Vb_2$ and $Vb_3$ and periodically quenching NMOS transistor M7 by driving the gate terminal of M7 with a logic 1 voltage (above the threshold voltage of M7). When the quench signal is received, the coupled oscillators will gradually establish oscillation even without any incoming signal at the antenna 12. When the antenna 12 receives an input signal at $2f_0$, the NMOS transistors M1 and M2 within the symmetric injection circuit will provide super-harmonic injection currents into the oscillator tanks. Asymmetric injection may also be utilized as described herein with respect to FIG. 4. The super-harmonic regenerative principle predicts that the oscillation start-up time is inversely proportional to the received signal power in dB scale. Therefore, with higher input signal power, the coupled oscillators will have a shorter start-up time, as shown in the simulation of FIG. 3, where varying start-up times (x-axis) are shown as a function of antenna input power (Pin). Based on a calculated link budget, the input power strength at the receiver antenna 12 is about −85 dBm with 1 m communication range, while the receiver noise floor lies around −120 dBm. Moreover, the oscillation start-up time difference is about 6 ns when the input power is −80 dBm versus −120 dBm, based on which the frequency of the quench signal can be determined. Here, NMOS transistors M8, M9 and the pull-up resistor load (40K ohms) form an envelope detector 14 for received signals, which means that signal demodulation can be performed by comparing the output voltage level of the envelope detector (at the drain terminals of M8, M9) with a reference value using a comparator (not shown).

Referring now to FIG. 4, a packaged bidirectional radio frequency transceiver 10', 10" (with modified dual-feed slot antenna 12') is illustrated under conditions of transmission (transmitting mode Tx) and reception (receiving mode Rx), with corresponding timing diagrams. As illustrated, a bias voltage applied to the emitter terminal of NMOS transistor M1 can be controlled to selectively enable/disable M1, which operates as an asymmetric injection (e.g., current/voltage injection) circuit during the receiving mode Rx. The matched oscillators that make up the oscillator core (OC) are defined by NMOS transistors M3-M6 and transmission lines TL3-TL6, connected as illustrated. Additional transmission lines TL1, TL2 are provided to the pair of antenna feeds. The dual-function varactor/envelope detector 14 includes NMOS transistors M7-M8. During the transmitting mode Tx, equal bias voltages of Vctrl are applied to the varactor to support frequency tuning. However, during the receiving mode Rx, current is allowed to flow through M7-M8 and an envelope detector output signal (ED_OUT) is taken from the commonly-connected drain terminals, as shown.

During the transmitting mode, the two coupled oscillators operate at $f_0$=160 GHz to thereby generate a $2^{nd}$ harmonic signal ($2f_0$=320 GHz) as the matched THz output signals to the antenna feeds. As will be understood by those skilled in the art, the cross-coupled transistors $M_3$-$M_6$ (within the oscillator core OC) provide differential negative transconductance ($g_m$) for oscillation, and the drain terminal transmission lines $TL_3$-$TL_6$ and the built-in device parasitic capacitors form the resonator tank at $f_0$=160 GHz. The transmission lines further perform impedance matching to the on-chip slot antenna 12' at $2f_0$ to maximize the output power ($P_{out}$), and the two in-phase $2f_0$ currents are power-combined on the antenna 12'. Transistors $M_7$ and $M_8$ are used as varactors for frequency tuning. The Tx OOK data signal directly drives the tail current source $M_2$ to thereby provide bits-to-THz transmitting. The Rx injection transistor $M_1$ is turned off in the Tx mode by setting its emitter terminal to Vdd, as shown.

The on-chip antenna 12' consists of a $V_{DD}$ plane and a GND plane, as shown. The $V_{DD}$ plane is DC-connected to the drain nodes of oscillator core transistors $M_3$-$M_6$ for biasing purposes. Sufficient bypass capacitors are needed to decouple the $V_{DD}$ plane from the GND plane. However, on-chip capacitors typically exhibit poor quality factor (Q) in the THz range, which can lead to severe signal loss to the THz radiation signal and radiation efficiency degradation, especially when the antenna input impedance is low (e.g., 11Ω). To minimize the loss from the bypass capacitors, the slot antenna 12' is designed with a total length of around λ. Based on this design, the slot antenna 12' presents two current nulls and the $V_{DD}$ plane and the GND plane are separated and bypassed at these two current nulls, which ensures minimal signal loss through the bypass capacitors. Different supply feeding and/or bypassing circuits can be employed when different numbers or types of antenna are used.

Alternatively, in the Rx mode, the radio 10" is configured as a super-harmonic super-regenerative Rx to detect the incoming OOK-modulated THz signal at $2f_0$. Once a $2f_0$ input signal is received by the on-chip antenna 12', $M_1$ injects a $2f_0$ current into the resonator tank and creates a small asymmetry to perturb the fundamental oscillation start-up at $f_0$. Thus, as shown by the timing diagram on the right side of FIG. 4, the received OOK signal ("1" or "0") leads to different Rx oscillation start-up times ("0"=long, "1"=short). As previously explained with respect to FIGS. 1A-1B, transistors $M_7$ and $M_8$ are operated as an envelope detector (ED), which generates signal ED_OUT. By periodically quenching the tail current source $M_2$ (with 4× oversampling), OOK demodulation can be realized by tracking the digitized oscillation start-up time encoded within ED_OUT. This super-harmonic super-regenerative Rx substantially improves the Rx sensitivity over non-coherent THz power-detector Rx, yet exhibits significant sensitivity.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a transceiver on an integrated circuit chip, said transceiver comprising first and second oscillators therein, which are electrically coupled together and configured to pass transmit data therethrough when said transceiver is operating as a transmitter and pass receive data therethrough when said transceiver is operating as a receiver; and
   a multi-feed antenna on the integrated circuit chip, said antenna having first and second feeds electrically, magnetically or electromagnetically coupled to the first and second oscillators, respectively;
   wherein said transceiver is responsive to an on-off-keying (OOK) modulation control signal or an amplitude-shift keying (ASK) modulation control signal when said transceiver is operated as a radio frequency (RF) transmitter; and
   wherein said transceiver comprises a tail current source configured as a pull-down transistor having a gate terminal responsive to the OOK or ASK modulation control signal when said transceiver is operated as a radio frequency transmitter and responsive to a periodic quench signal when said transceiver is operated as a radio frequency receiver.

2. The device of claim 1, wherein first output terminals of the first and second oscillators are electrically shorted together and second output terminals of the first and second oscillators are electrically shorted together.

3. The device of claim 2, wherein a common-mode node of the first oscillator is electrically, magnetically or electromagnetically coupled to the first feed and a common-mode node of the second oscillator is electrically, magnetically or electromagnetically coupled to the second feed.

4. The device of claim 1, wherein a common-mode node of the first oscillator is electrically, magnetically or electromagnetically coupled to the first feed and a common-mode node of the second oscillator is electrically coupled to the second feed.

5. The device of claim 1, wherein the first and second oscillators are equivalent oscillators having shared differential output terminals; and wherein the first and second oscillators are configured to operate collectively as a push-push harmonic oscillator that generates a second harmonic signal from a fundamental oscillation signal.

6. The device of claim 5, further comprising a pair of MOS transistors having commonly-connected drain terminals and commonly-connected source terminals; and wherein a gate terminal of a first of the pair of MOS transistors is electrically coupled to a first of the shared differential output terminals and a gate terminal of a second of the pair of MOS transistors is electrically coupled to a second of the shared differential output terminals.

7. The device of claim 1, wherein said transceiver and said multi-feed antenna are packaged together within an integrated circuit package.

8. The device of claim 5,
wherein said transceiver comprises a first pair of load inductors having respective first terminals electrically connected to corresponding ones of the differential output terminals of the first oscillator and a second pair of load inductors having respective first terminals electrically connected to corresponding ones of the differential output terminals of the second oscillator;
wherein the first and second pairs of load inductors are configured as microstrip transmission lines;
wherein second terminals of the first pair of load inductors are electrically coupled together and coupled to the first feed of said multi-feed antenna; and
wherein second terminals of the second pair of load inductors are electrically coupled together and coupled to the second feed of said multi-feed antenna.

9. The device of claim 7, wherein at least a first portion of the integrated circuit chip extending opposite said multi-feed antenna is sufficiently thin to enable said transceiver to transmit and receive data through the integrated circuit chip and the integrated circuit package.

10. The device of claim 9, wherein the first portion of the integrated circuit chip has a thickness of about 50 microns.

11. The device of claim 1, wherein the periodic quench signal has a non-uniform duty cycle.

12. An integrated circuit device, comprising:
a transceiver on an integrated circuit chip, said transceiver comprising:
first and second oscillators therein, which are electrically coupled together and configured to pass transmit data therethrough when said transceiver is operating as a transmitter and pass receive data therethrough when said transceiver is operating as a receiver; and
a tail current source having a control terminal responsive to a periodic quench signal when the transceiver is operating as a receiver; and
a multi-feed antenna on the integrated circuit chip, said antenna having first and second feeds electrically, magnetically or electromagnetically coupled to the first and second oscillators, respectively.

13. The device of claim 12, further comprising an envelope detector electrically coupled said transceiver, said envelope detector configured to generate an output signal that encodes a digitized oscillation start-up time of said transceiver when said transceiver is operating as a receiver.

14. The device of claim 13, wherein the output signal generated by said envelope detector is in-sync with the periodic quench signal.

15. An integrated circuit device, comprising:
a transceiver on a first integrated circuit substrate, said transceiver comprising a pair of oscillators that encode Tx and Rx data therein when said transceiver is operating as a transmitter and receiver, respectively;
an antenna on a second integrated circuit substrate, which is separate from or coextensive with the first integrated circuit substrate, said antenna having a first feed electrically, magnetically or electromagnetically coupled to a first one of the pair of oscillators and a second feed electrically, magnetically or electromagnetically coupled to a second one of the pair of oscillators; and
a tail current source electrically coupled to the pair of oscillators, said tail current source having a control terminal responsive to: (i) a modulation control signal when said transceiver is configured as a transmitter to thereby pass Tx data through the pair of oscillators, and (ii) a periodic quench signal when said transceiver is configured as a receiver to thereby pass Rx data through the pair of oscillators.

16. The device of claim 15, wherein the periodic quench signal has a non-uniform duty cycle.

17. The device of claim 15, wherein said transceiver, said antenna and said tail current source are packaged together within an integrated circuit package.

18. The device of claim 15, wherein the modulation control signal is an on-off-keying (OOK) modulation control signal or an amplitude-shift-keying (ASK) modulation control signal.

19. The device of claim 15, further comprising a dual-function varactor/envelope detector having input terminals electrically coupled to the first one of the pair of oscillators, said dual-function varactor/envelope detector configured to operate as a varactor when said transceiver is configured as a transmitter and configured to operate as an envelope detector when said transceiver is configured as a receiver.

20. The device of claim 15, further comprising a first injection transistor having a gate terminal coupled to the first feed and a first current carrying terminal electrically coupled to a node of the first one of the pair of oscillators.

21. The device of claim 15, further comprising a first injection transistor having a gate terminal coupled to the first feed, a first current carrying terminal electrically coupled to a node of the first one of the pair of oscillators, and second current carrying terminal responsive to: (i) a first bias voltage when said transceiver is configured as a transmitter, and (ii) a second bias voltage, which is unequal to the first bias voltage, when said transceiver is configured as a receiver.

22. An integrated circuit device, comprising:
a transceiver on a first integrated circuit substrate, said transceiver comprising at least a first oscillator, which is configured to pass transmit data therethrough when said transceiver is operating as a transmitter and pass receive data therethrough when said transceiver is operating as a receiver;
an antenna on a second integrated circuit substrate, which is separate from or coextensive with the first integrated circuit substrate, said antenna having a feed electrically, magnetically or electromagnetically coupled to the first oscillator; and a tail current source electrically coupled to the first oscillator, said tail current source having a control terminal responsive to: (i) a modulation control signal when said transceiver is configured as a transmitter, and (ii) a periodic quench signal when said transceiver is configured as a receiver.

23. The device of claim 22, wherein the periodic quench signal has a non-uniform duty cycle.

24. The device of claim 22, wherein said transceiver, said antenna and said tail current source are packaged together within an integrated circuit package.

25. The device of claim 22, wherein the modulation control signal is an on-off-keying (OOK) modulation control signal or an amplitude-shift-keying (ASK) modulation control signal.

26. The device of claim 22, further comprising a dual-function varactor/envelope detector electrically coupled to the first oscillator, said dual-function varactor/envelope detector configured to operate as a varactor when said transceiver is configured as a transmitter and configured to operate as an envelope detector when said transceiver is configured as a receiver.

27. The device of claim 26, wherein said envelope detector is configured to generate an output signal that encodes a digitized oscillation start-up time of said transceiver when said transceiver is configured as a receiver.

28. The device of claim 27, wherein the output signal generated by said envelope detector is in-sync with the periodic quench signal.

29. The device of claim 22, further comprising a first injection transistor having a gate terminal coupled to the feed, a first current carrying terminal electrically coupled to a node of the first oscillator, and a second current carrying terminal responsive to: (i) a first bias voltage when said transceiver is configured as a transmitter, and (ii) a second bias voltage, which is unequal to the first bias voltage, when said transceiver is configured as a receiver.

* * * * *